United States Patent
Britton et al.

(10) Patent No.: US 8,314,634 B1
(45) Date of Patent: Nov. 20, 2012

(54) POWER CONTROL BLOCK WITH OUTPUT GLITCH PROTECTION

(75) Inventors: Barry Britton, Slatington, PA (US); Richard Booth, Riegelsville, PA (US); Yang Xu, Shanghai (CN); Tawei David Li, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 1 day.

(21) Appl. No.: 13/079,578

(22) Filed: Apr. 4, 2011

(51) Int. Cl.
*H03K 17/16* (2006.01)
*H03K 19/003* (2006.01)

(52) U.S. Cl. ............... 326/33; 326/34; 326/95; 713/320

(58) Field of Classification Search .............. 326/21, 326/26–28, 31, 33–34, 93–98
See application file for complete search history.

(56) References Cited

U.S. PATENT DOCUMENTS

| | | | |
|---|---|---|---|
| 5,300,831 A | 4/1994 | Pham et al. | |
| 5,428,317 A | 6/1995 | Sanchez et al. | |
| 6,014,048 A | 1/2000 | Talaga, Jr. et al. | |
| 7,227,921 B2 | 6/2007 | Butler et al. | |
| 2008/0088344 A1* | 4/2008 | Mamidipaka | 326/93 |
| 2011/0025383 A1* | 2/2011 | De Martini et al. | 327/143 |

* cited by examiner

*Primary Examiner* — Shawki Ismail
*Assistant Examiner* — Jany Tran
(74) *Attorney, Agent, or Firm* — Haynes and Boone, LLP

(57) ABSTRACT

Techniques are provided to reduce glitches at an output signal node when a device is switched to and from a low power operation mode. In one example, a method of operating a device includes providing power to operate a signal source of the device during a normal operation mode of the device. The method also includes passing an output signal from the signal source through a signal path to an output node during the normal operation mode. The method also includes receiving an operation mode signal to switch the device from the normal operation mode to a low power operation mode. The method also includes disabling the signal path to prevent glitches from appearing at the output node during the switch from the normal operation mode to the low power operation mode. The method also includes continuing providing power to the signal source until after the signal path is disabled.

20 Claims, 6 Drawing Sheets

US 8,314,634 B1

POWER CONTROL BLOCK WITH OUTPUT GLITCH PROTECTION

TECHNICAL FIELD

The invention relates generally to control circuitry and, more particularly, to control circuitry for reducing power consumption.

BACKGROUND

Device leakage current is a problem for many modern circuit designs, such as those implemented with deep submicron technology. In particular, device leakage current can significantly reduce or limit the performance of low power circuits, such as battery powered circuits.

One approach to reducing leakage current is to increase the length (e.g., channel length) of devices (e.g., transistors). However, such modifications may impact device performance by providing less drain saturation current for a given device geometry. In addition, larger devices typically require more die area and increased cost.

Another approach to reducing leakage current is to reduce the density of logic circuitry in a given circuit design. However, such changes are not always practical in view of application requirements which may need certain minimum logic operations to be performed.

Yet another approach to reducing leakage current is to work with device manufacturers to increase the efficiency of individual devices. However, such an approach may require cumbersome additional processing steps that are time intensive, expensive, and impractical to develop and verify the effectiveness thereof.

As a result, there is a need for an improved approach to reducing device leakage current that improves upon one or more of the approaches discussed above.

SUMMARY

In accordance with one embodiment of the invention, a method of operating a device includes providing power to operate a signal source of the device during a normal operation mode of the device; passing an output signal from the signal source through a signal path to an output node during the normal operation mode; receiving an operation mode signal to switch the device from the normal operation mode to a low power operation mode; disabling the signal path to prevent glitches from appearing at the output node during the switch from the normal operation mode to the low power operation mode; and continuing providing power to the signal source until after the signal path is disabled.

In accordance with another embodiment of the invention, a device includes a signal source adapted to provide an output signal when powered; a power switch; an output node; a signal path adapted to pass the output signal from the signal source to the output node during a normal operation mode of the device; and a power control block adapted to operate the power switch to provide power to operate the signal source during the normal operation mode of the device, receive an operation mode signal to switch the device from the normal operation mode to a low power operation mode, disable the signal path to prevent glitches from appearing at the output node during the switch from the normal operation mode to the low power operation mode, and operate the power switch to continue to provide power to operate the signal source until after the signal path is disabled.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

In accordance with embodiments discussed herein, a system such as a PLD may be selectively switched between a normal operation mode and a standby operation mode (e.g., a low power mode or idle mode). For example, functional circuit blocks and output drivers of a PLD may be selectively powered on (e.g., for normal operation mode) or off (e.g., for standby operation mode) to reduce device leakage current. Such operations may be performed without introducing glitches (e.g., improper signal values, narrow pulse widths that fall outside specifications, or improper logic states) on output signals or signals passed through the system. This can reduce the possibility of signal errors propagating to downstream logic. In various embodiments, different portions of a PLD may be implemented to support or not support standby operation mode. For example, in one embodiment, portions of a PLD that interact with control pins or overall control logic of the PLD may not enter standby operation mode.

In accordance with additional embodiments discussed herein, a PLL (e.g., implemented as part of a PLD or otherwise) may be selectively operated with internal or external feedback paths. For example, an external feedback path may be used during normal operation mode in which a PLL output signal passes through various other circuits that are powered on during normal operation mode. The PLL may be switched to an internal feedback path during standby operation mode in which some or all of the other circuits of the external feedback path are powered off.

By operating the PLL using the internal feedback path at approximately the same frequency as the external feedback path during a switching from standby operation mode to normal operation mode, an internal oscillator of the PLL may acquire frequency lock while the other circuits of the external feedback path are powered off. As a result, the PLL internal oscillator may be ready to operate when the other circuits of the external feedback path are powered on to resume normal operation mode. In this regard, after the other circuits of the external feedback path are powered on, the PLL may be switched to the external feedback path and may quickly acquire frequency lock due to the previous operation of the PLL using the internal feedback path.

Figure 1:
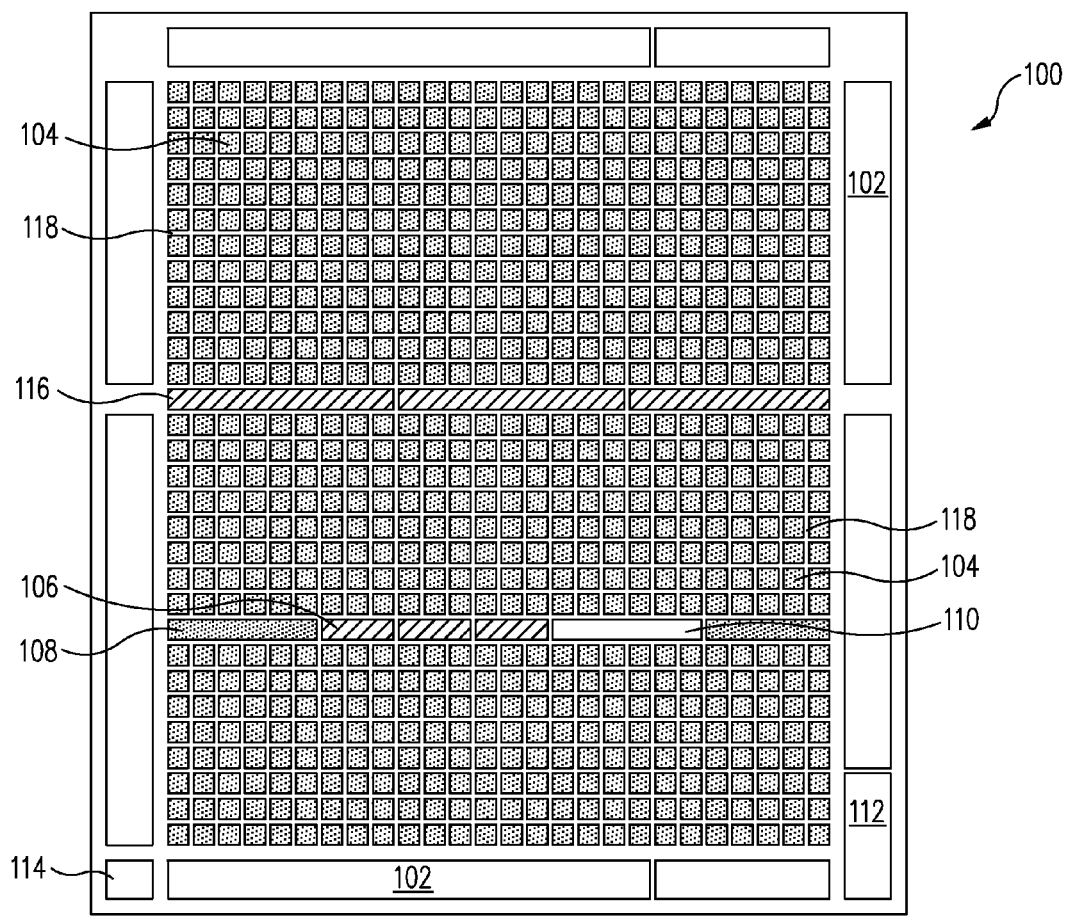
FIG. 1 illustrates a block diagram of a programmable logic device (PLD) in accordance with an embodiment of the invention.

Referring now to the figures, FIG. 1 illustrates a block diagram of a programmable logic device (PLD) 100 in accordance with an embodiment of the invention. In various embodiments, PLD 100 may be implemented as a PLD in the XO2 family of devices available from Lattice Semiconductor Corporation of Hillsboro, Oreg.

PLD 100 (e.g., a field programmable gate array (FPGA), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)). I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100.

PLD 100 may also include blocks of memory 106 (e.g., blocks of EEPROM, block SRAM, and/or flash memory), clock-related circuitry 108 (e.g., PLL and/or DLL circuits), configuration logic 110 (e.g., for startup, decryption, encryption, multiple-boot support (e.g., dual boot support), and/or error detection), a configuration port 112, configuration memory 114, special function blocks 116 (e.g., digital signal processing (DSP) blocks or other forms of multiply and accumulate circuit functionality), and/or routing resources 118. In general, the various elements of PLD 100 may be used to perform their intended functions for the desired application, as would be understood by one skilled in the art.

For example, configuration port 112 may be used for programming PLD 100, such as memory 106 and/or configuration memory 114 or transferring information (e.g., various types of data and/or control signals) to/from PLD 100 as would be understood by one skilled in the art. For example, configuration port 112 may include a first programming port (which may represent a central processing unit (CPU) port, a peripheral data port, an SPI interface, and/or a sysCONFIG programming port) and/or a second programming port such as a joint test action group (STAG) port (e.g., by employing standards such as Institute of Electrical and Electronics Engineers (IEEE) 1149.1 or 1532 standards). Configuration port 112 typically, for example, may be included to receive configuration data and commands to support serial or parallel device configuration and information transfer.

It should be understood that the number and placement of the various elements, such as I/O blocks 102, logic blocks 104, memory 106, clock-related circuitry 108, configuration logic 110, configuration port 112, configuration memory 114, special function blocks 116, and routing resources 118, are not limiting and may depend upon the desired application. For example, special function blocks 116 are optional and various other elements may not be required for a desired application or design specification (e.g., for the type of programmable device selected).

Furthermore, it should be understood that the elements are illustrated in block form for clarity and that certain elements, such as for example configuration memory 114 or routing resources 118, would typically be distributed throughout PLD 100, such as in and between logic blocks 104, to perform their conventional functions (e.g., storing configuration data that configures PLD 100 or providing interconnect structure within PLD 100, respectively). It should also be understood that the various embodiments of the invention as disclosed herein are not limited to programmable logic devices, such as PLD 100, and may be applied to various other types of programmable devices, as would be understood by one skilled in the art.

The various techniques disclosed herein are applicable to a wide variety of integrated circuits and applications. As an exemplary implementation, a PLD will be utilized to illustrate the techniques in accordance with one or more embodiments of the invention. However, it should be understood that this is not limiting and that the techniques disclosed herein may be implemented as desired, in accordance with one or more embodiments of the invention, within various types of circuits and within the various types of integrated circuits. Therefore, the techniques may be applied to circuits other than memory and to integrated circuits other than PLDs.

Figure 2:
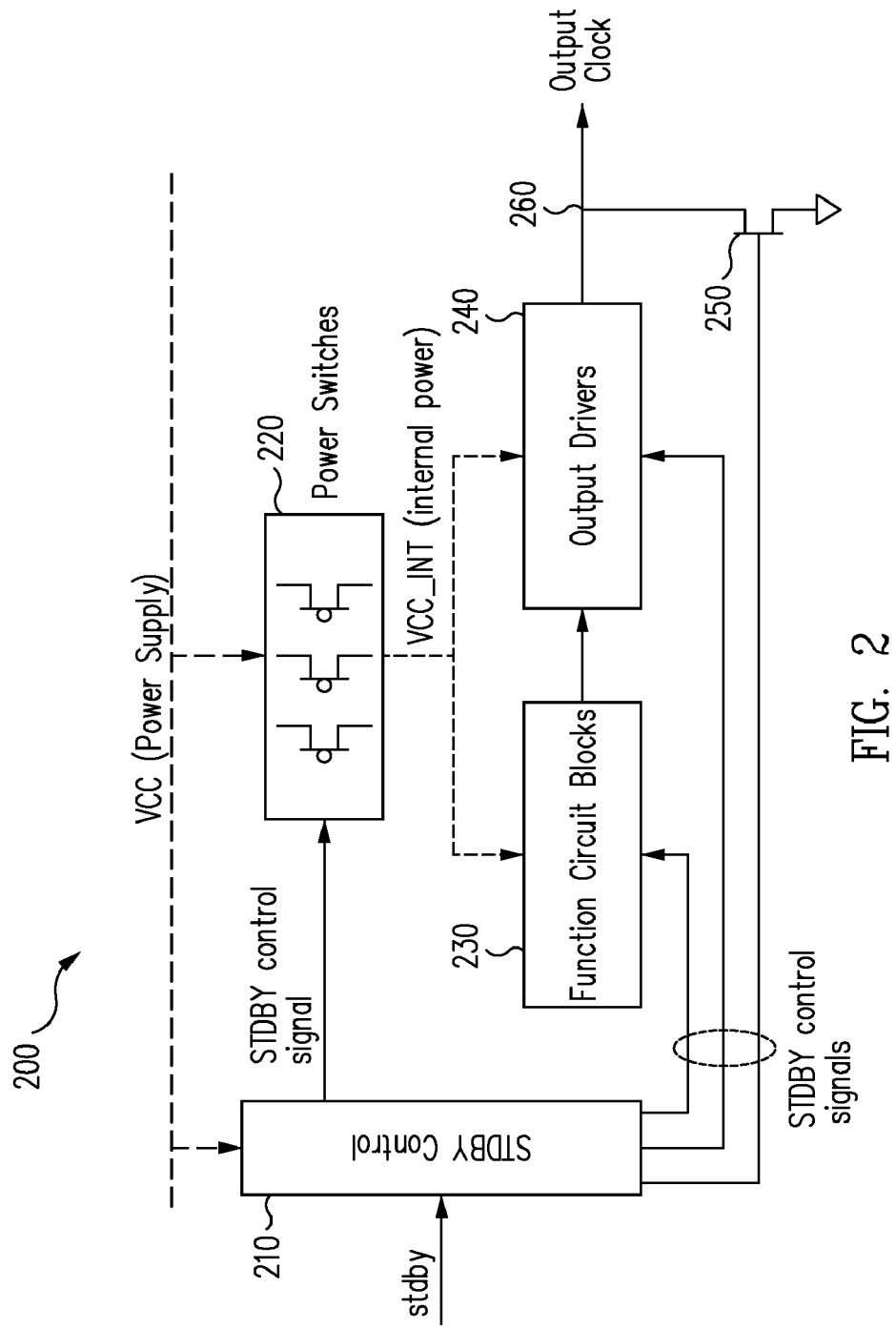
FIG. 2 illustrates a block diagram of a system to provide output glitch protection in accordance with an embodiment of the invention.

FIG. 2 illustrates a block diagram of a system 200 to provide output glitch protection in accordance with an embodiment of the invention. System 200 includes a power control block 210, power switches 220, function circuit blocks 230, output drivers 240, and one or more pulldown transistors 250. In one embodiment, system 200 may be implemented in appropriate portions of PLD 100. For example, power control block 210 and power switches 220 may be implemented by configuration logic 110, function circuit blocks 230 may be implemented by logic blocks 104 or clock-related circuitry 108, and output drivers 240 and pulldown transistors 250 may be implemented by I/O blocks 102.

Power control block 210 and power switches 220 are connected to a power supply VCC. Power switches 220 may selectively provide power from power supply VCC to function circuit blocks 230 and output drivers 240. Power control block 210 may receive a signal stdby (e.g., an operation mode signal) from, for example, configuration logic 110 or an external signal received by PLD 100. In one embodiment, signal stdby may be a full chip control signal that indicates the operative state of PLD 100. For example, a logic low value for signal stdby may indicate normal operation mode in which PLD 100 operates in accordance with a user-specified configuration. A logic high value for signal stdby may indicate standby operation mode in which PLD 100 enters a reduced power state and normal operation mode is suspended.

After signal stdby transitions from a logic low value to a logic high value, PLD 100 may switch from normal operation mode to standby operation mode. Conversely, after signal stdby transitions from a logic high value to a logic low value, PLD 100 may switch from standby operation mode to normal operation mode. Although logic low and logic high values of various signals (e.g., logic states) are referred to in this disclosure, such values are provided for purposes of example and different values (e.g., opposite logic values or other values) may be used where appropriate.

Power control block 210 provides various STDBY control signals in response to signal stdby. Power control block 210 may use the STDBY control signals to selectively turn off power switches 220, control the operation of function circuit blocks 230 and output drivers 240, and pull down a node 260 by pulldown transistors 250, all in a manner that reduces the possibility of signal glitches appearing at node 260 or signal contention when entering or exiting standby operation mode.

Figure 3:
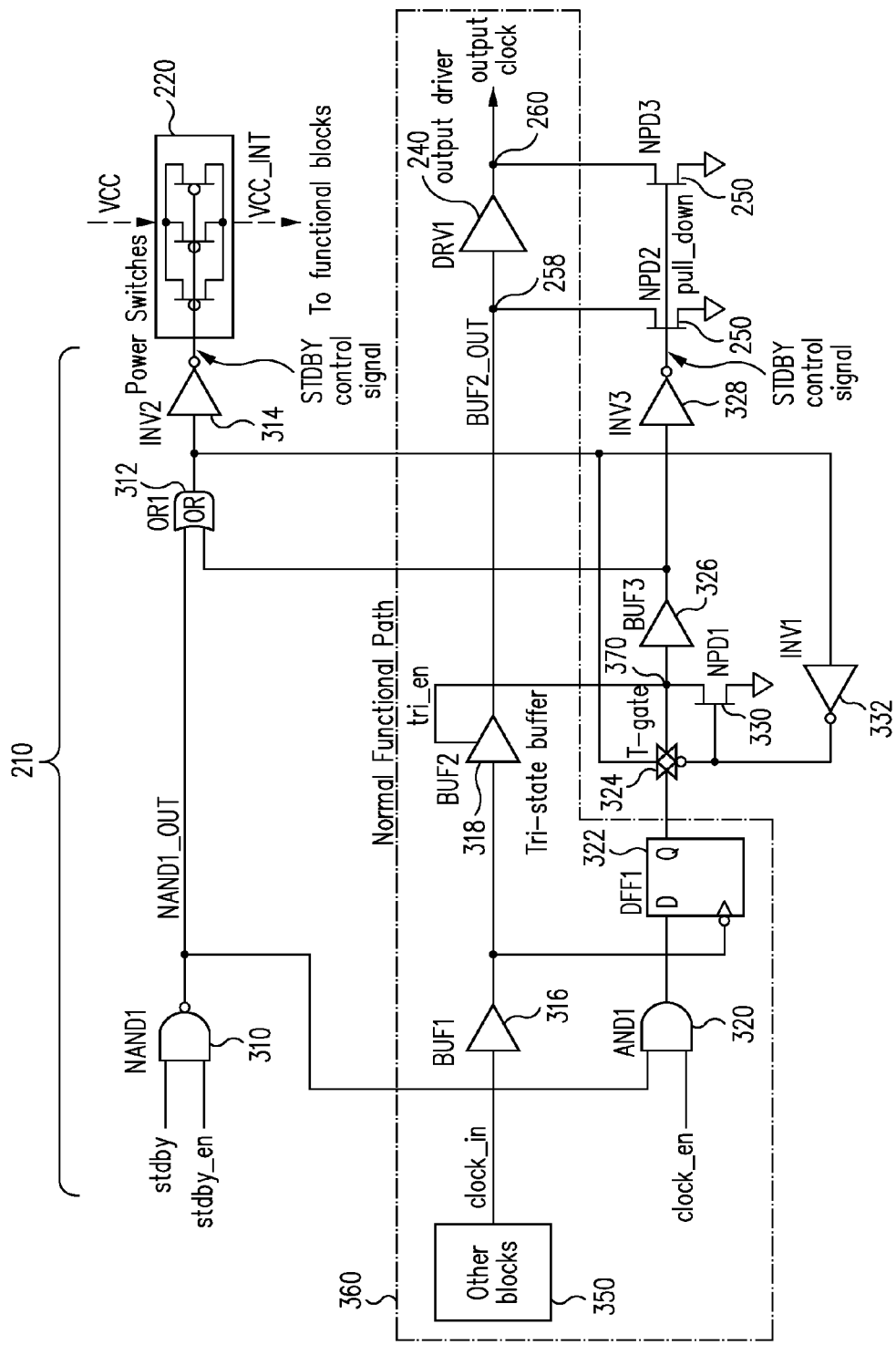
FIG. 3 illustrates portions of a power control block and other components of the system of FIG. 2 in accordance with an embodiment of the invention.

FIG. 3 illustrates portions of power control block 210 and other components of system 200 of FIG. 2 in accordance with an embodiment of the invention. In the embodiment illustrated in FIG. 3, power control block 210 includes various components which may be used to provide STDBY control signals to power switches 220 and pulldown transistors 250. Such components include, for example: logic 310, 312, 314, 320, 328, and 332; buffers 316, 318, and 326; flip flop 322; transmission gate 324; transistor 330; and various interconnections.

Also shown in FIG. 3 are other blocks 350 which may be implemented, for example, as any block or circuit that provides or passes one or more input signals (e.g., one or more clock_in signals or any other types of signals) through to node 260 as one or more output signals (e.g., one or more output clock signals or any other types of signals). For example, in one embodiment, other blocks 350 may include one or more signal sources such as PLLs described herein or other signal sources. In various embodiments, other blocks 350 may be one or more function circuit blocks 230, logic blocks 104, clock-related circuitry 108, or any other portion of PLD 100 that generates signals.

Various components shown in FIG. 3 collectively provide a normal functional path 360 which may be used to pass signals from other blocks 350 through to node 260. In this regard, during normal operation mode, signal clock_in may pass from other blocks 350 through to node 260 as a signal output clock. During standby operation mode, power control block 210 may prevent signal clock_in from passing through to node 260 and may pull down nodes 258 and 260 to a minimum voltage.

In one embodiment, other blocks 350, buffers 316 and 318, output driver 240, logic 320, and flip flop 322 may be powered by a power signal VCC_INT received from power switches 220. In this regard, such components may be powered on during normal operation mode, may be powered off in a desired sequence when switching to standby operation mode, and may be powered on in another desired sequence when switching back to normal operation mode.

Power control block 210 receives signal stdby_en which, in one embodiment, may be a user-programmable fuse to selectively permit or prevent PLD 100 from entering standby operation mode. Logic 310 may be used to qualify signal stdby by signal stdby_en. For example, if signal stdby_en is set to a logic high value, then the value of signal NAND1_OUT passed by logic 210 may switch in response to signal stdby to turn off various components to enter standby operation mode as further discussed. If signal stdby_en is set to a logic low value, then the value of signal NAND1_OUT passed by logic 210 may remain at a logic high value to select normal operation mode regardless of the value of signal stdby.

Logic 320 receives signal clock_en which may be used to either disable node 260 by forcing pulldown transistors 250 to turn on (e.g., when signal clock_en is set to a logic low value) or permit node 260 to be selectively disabled in response to signal stdby (e.g., when signal clock_en is set to a logic low value).

Signal tri_en is generated from the output of transmission gate 324 which samples the output of flip flop 322. In standby operation mode, signal tri_en may provide a logic low value to turn off buffer 318 and prevent signal clock_in from passing from buffer 318 to output driver 240. In normal operation mode, signal tri_en may provide a logic high value to turn on buffer 318 and permit signal clock_in to pass from buffer 318 to output driver 240.

Figure 4:
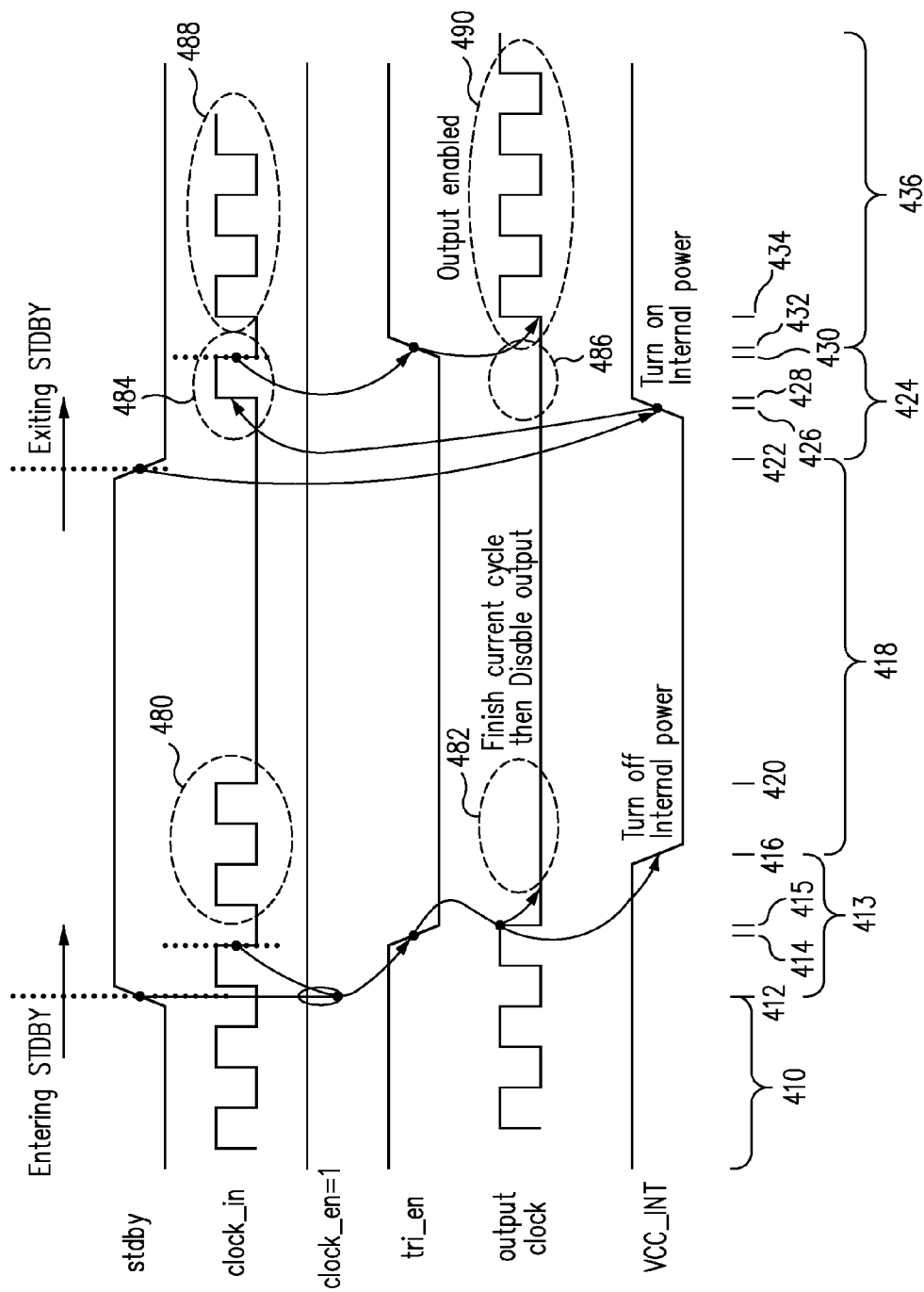
FIG. 4 illustrates a timing diagram of signals for various components of FIGS. 2 and 3 in accordance with an embodiment of the invention.

FIG. 4 illustrates a timing diagram of signals for various components of FIGS. 2 and 3 in accordance with an embodiment of the invention. In particular, FIG. 4 identifies the operation of signals during a process of entering and exiting standby operation mode. At all times in FIG. 4, signal clock_en is set to a logic high value to permit node 260 to be selectively disabled in response to signal stdby. Also, in FIG. 4, it is assumed that signal stdby_en is set to a logic high value to permit PLD 100 to enter standby operation mode if desired.

During a time period 410 (e.g., prior to a time 412), signal stdby is set to a logic low value and PLD 100 is in normal operation mode. PLD 100 may remain in normal operation mode indefinitely while signal stdby remains at a logic low value.

During time period 410, signal clock_in passes through buffers 316 and 318, and through output driver 250 to provide signal output clock at node 260 as shown in FIG. 4. Also during time period 410, logic 310 sets signal NAND1_OUT to a logic high value which passes through logic 312 to logic 314 which provides a logic low value to power switches 220. As a result, power switches 220 remain turned on to set power signal VCC_INT to a logic high value as identified in FIG. 4 and thus provide power to various components of FIG. 3 as discussed.

Also during time period 410, logic 320 provides a logic high value which is captured by flip flop 322 on the falling edges (e.g., transitions) of signal clock_in. Although falling edge transitions are described, rising edge transitions may be used in other embodiments. Flip flop 322 provides the captured logic high value to transmission gate 324.

Also during time period 410, transmission gate 324 remains turned on (e.g., open to pass signals) in response to signals provided by logic 312 and 332, and transistor 330 remains turned off in response to the signal provided by logic 332. As a result, transmission gate 324 provides a logic high value to a node 370 which may be used to provide a logic high value for signal tri_en to keep buffer 318 turned on. The logic high value at node 370 passes through buffer 326 to logic 312 and also to logic 328 which keeps pulldown transistors 250 turned off.

During a time period 413 (e.g., beginning at time 412 and ending at a time 416), PLD 100 switches between normal operation mode and standby operation mode. At time 412, signal stdby transitions to a logic high value. As a result, power control block 210 begins to enter standby operation mode. In response to the logic high value of signal stdby, signal NAND1_OUT switches to a logic low value. As a result, logic 320 provides a logic low value to flip flop 322. Flip flop 322 captures the logic low value at the next falling edge of signal clock_in which occurs at a time 414. As a result, flip flop 322 provides a logic low value to transmission gate 324.

At time 414, transmission gate 324 temporarily remains on to pass the logic low value through to node 370, and then turns off at a time 415. In this regard, although signal NAND1_OUT switches to a logic low value at time 412, logic 312 may continue to provide a logic high value (e.g., to keep transmission gate 324 turned on and keep transistor 330 turned off) until the new logic low value captured by flip flop 322 propagates through transmission gate 324, node 370, buffer 326, and on to logic 312. After receiving the new logic low value captured by flip flop 322, logic 312 switches to a logic low value which causes transmission gate 324 to turn off (e.g., closed to prevent signals from passing through) and transistor 330 to turn on at time 415. As a result, node 370 and signal tri_en will remain pulled down to the logic low value following time 414. By keeping transmission gate 324 turned off during standby operation mode, transistor 330 may maintain node 370 and signal tri_en at a consistent logic low value.

Also at time 415, the logic low value of signal tri_en turns off buffer 318. As a result, additional transitions of signal clock_in (denoted by label 480) will not be passed through to signal output clock (denoted by label 482). Advantageously, after the falling edge of signal clock_in passes through to signal output clock, no further signal transitions are provided at node 260 until after PLD 100 returns to normal operation mode. As a result, power may be interrupted to various components of FIG. 3 during standby operation mode without introducing glitches in signal output clock at node 260.

Also at time 415, the logic low value at node 370 passes through buffer 326 and on to logic 328 which causes pull-down transistors 250 to turn on and thus pull down nodes 258 and 260. Advantageously, the pulling down of nodes 258 and 260 may further prevent the introduction of glitches at node 260 during standby operation mode.

At time 416, the logic low value provided by logic 312 causes logic 314 to provide a logic high value to power switches 220. As a result, power switches 220 turn off which cause power signal VCC_INT to switch off as shown in FIG. 4. Because buffer 318 was previously turned off and node 260 was pulled down at time 414, the turning off of power switches 220 will not cause any glitches to be introduced at node 260.

In one embodiment, the delay between time 414 and time 416 may be attributed to signal propagation delays and logic delays. For example, in addition to the signal provided by the logic low value at node 370 of normal functional path 360, additional signals may be provided from other paths (e.g., other portions of PLD 100) to logic 312. Such signals may be processed by logic 312 (e.g., an OR gate in one embodiment) and the result of logic 312 may be provided to logic 314 to turn off power switches 220. In this regard, if multiple signals are provided to logic 312, then such signals may switch (e.g., to logic low values in one embodiment) between time 414 and time 416. Accordingly, power switches 220 may not be turned off until time 416 (e.g., after all such signals have switched to logic low values in one embodiment).

During a time period 418 (e.g., beginning at time 416 and ending at a time 422), PLD 100 remains in standby operation mode. While in standby operation mode, various other components of PLD 100 may be turned off if desired to conserve power. For example, at a time 420, signal clock_in turns off following the switching off of power signal VCC_INT. In another embodiment, signal clock_in may not switch off and may remain operational. PLD 100 may remain in standby operation mode indefinitely while signal stdby remains at a logic high value.

During a time period 424 (e.g., beginning at time 422 and ending at a time 432), PLD 100 switches from standby operation mode to normal operation mode. At time 422, signal stdby transitions back to a logic low value. As a result, power control block 210 begins to exit standby operation mode. In response to the logic low value of signal stdby, signal NAND1_OUT switches to a logic high value which is provided to logic 320 which switches to providing a logic high value.

Also at time 422, logic 312 receives the logic high value of signal NAND1_OUT and provides a logic high value to transmission gate 324 and logic 332 to turn on transmission gate 324 and turn off transistor 330. As a result, node 370 and signal tri_en will remain available to switch to a logic high value in response to a logic high value provided by flip flop 322.

Also at time 422, logic 312 provides the logic high value to logic 314 which provides a logic low value. This logic value transition quickly flows through 312 and 314 to turn on power switches 220 and set signal VCC_INT to a logic high value at a time 426. The circuit path between logic 310, 312, and 314 is not blocked by other control logic (e.g., in one embodiment, the delay between time 422 and 426 may be attributed only to propagation delay). As a result, power switches 220 will be switched on quickly so that components receiving power from signal VCC_INT may rapidly resume normal operation mode functionality and switching activity.

At a time 428, signal clock_in begins operating, for example, in response to the turning on of power switches 220. However, buffer 318 and nodes 258 and 260 are not immediately enabled in response to the logic low value of signal stdby. In this regard, when signal clock_in begins operating at time 428, buffer 318 remains turned off and nodes 258 and 260 remain pulled down because of the logic low value at node 370 and signal tri_en. As a result, the first rising and falling transitions of signal clock_in (denoted by label 484) will not be passed through to signal output clock (denoted by label 486).

At a time 430, flip flop 322 captures (e.g., on the falling edge of signal clock_in) the logic high value provided by logic 320. As discussed, transmission gate 324 is now open and available to pass the logic high value captured by flip flop 322.

At time 432, the logic high value provided by flip flop 322 passes through transmission gate 324 to node 370 which causes signal tri_en to transition to a logic high value. As a result, buffer 318 will turn on and pulldown transistors 250 will stop pulling down nodes 258 and 260. By delaying the enabling of buffer 318 and nodes 258 and 260 until after power switches 220 turn on and between falling and edges of signal clock_in, glitches and signal contention may be avoided at node 260.

During a time period 436 (e.g., beginning at time 432 and continuing thereafter), PLD 100 operates in normal operation mode. For example, beginning at a time 434, the transitions of signal clock_in (denoted by label 488) will be passed through to signal output clock (denoted by label 490). PLD 100 may remain in normal operation mode indefinitely while signal stdby remains at a logic low value.

The switching between normal operation mode and standby operation mode may be repeated as desired. For example, at any time after time 432, standby control block 210 may operate as identified during time 412 and thereafter to enter and exit standby operation mode again.

Figure 5:
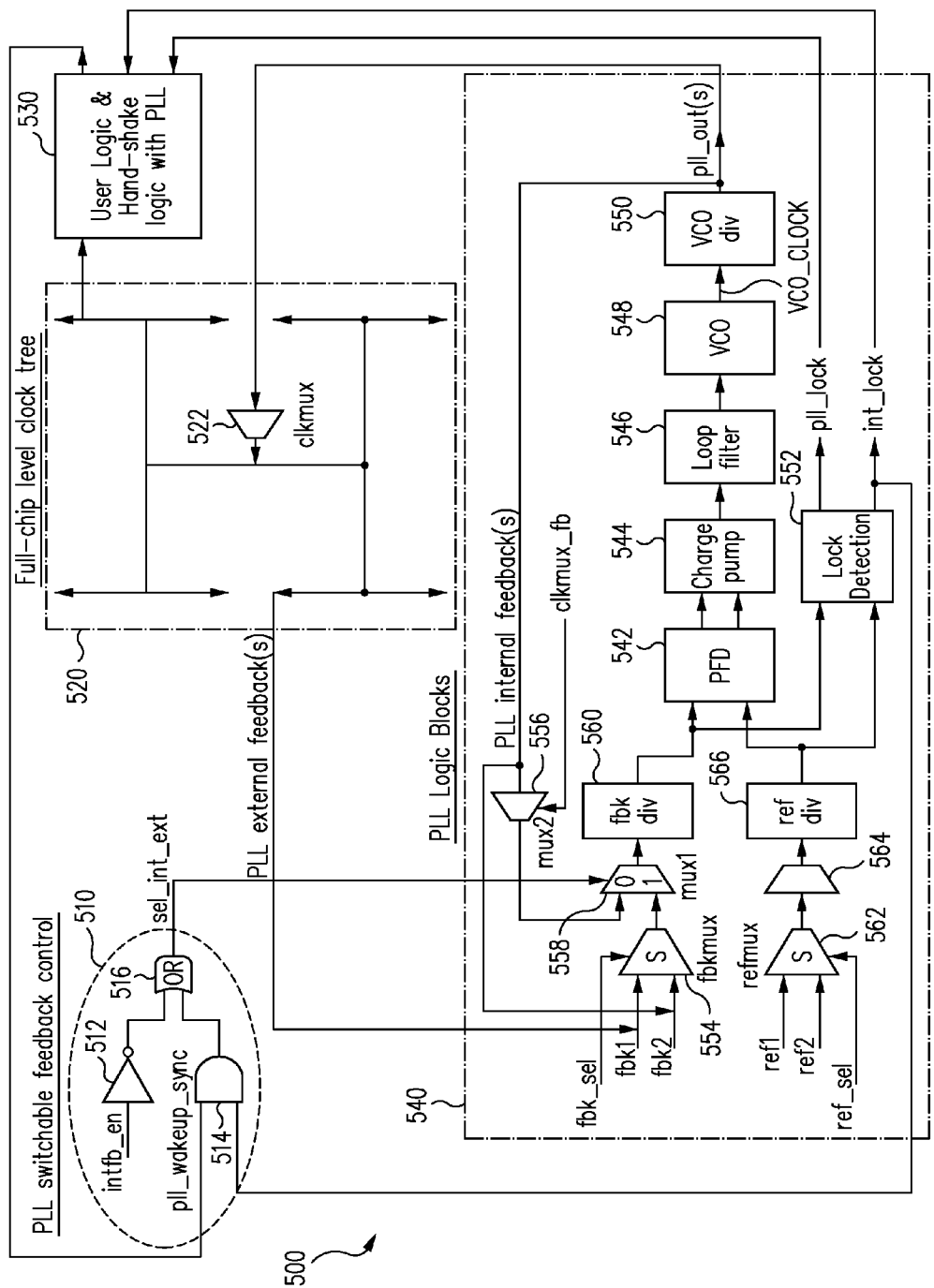
FIG. 5 illustrates a block diagram of a system to provide a phase locked loop (PLL) with selectable feedback paths in accordance with an embodiment of the invention.

FIG. 5 illustrates a block diagram of a system 500 to provide a PLL 540 with selectable feedback paths in accordance with an embodiment of the invention. System 500 includes feedback control logic 510, a clock tree 520, user logic 530, and PLL 540. In one embodiment, system 500 may be implemented in appropriate portions of PLD 100. For example, feedback control logic 510 and clock tree 520 may be implemented by clock-related circuitry 108, user logic 530 may be implemented by logic blocks 104, and PLL 540 may be implemented by other blocks 350, one or more function circuit blocks 230, logic blocks 104, clock-related circuitry 108, or any other portion of PLD 100 that generates signals.

In one embodiment where PLL 540 is implemented in other blocks 350 of FIG. 3, a signal pll_out from PLL 540 is used to provide signal clock_in identified in FIGS. 3 and 4. In this case, signal pll_out may exhibit glitch-free operation as PLL 540 and other components of PLD 100 are switched between normal operation mode and standby operation mode (e.g., when signal pll_out is passed as signal clock_in through normal functional path 360 to node 260 to provide signal output clock).

In one embodiment, PLL 540 may provide a plurality of signals pll_out which may be used to provide a plurality of signals PLL internal feedback through a plurality of internal feedback paths, and may also be used to provide a plurality of signals PLL external feedback through a plurality of external feedback paths. Thus, although individual signals pll_out, PLL internal feedback, and PLL external feedback are primarily discussed herein, it will be appreciated that multiple signals and multiple associated paths may be provided as may be desired in particular implementations.

Feedback control logic 510 includes logic 512, 514, and 516 which may cause PLL 540 to switch between the internal feedback path (e.g., a feedback path within PLL 540) and the external feedback path (e.g., a feedback path that includes circuits outside PLL 540 such as clock tree 520) in response to a signal pll_wakeup_sync (e.g., a feedback path status signal) provided by user logic 530.

In this regard, logic 512 receives a signal intfb_en which, in one embodiment, may be a user-programmable fuse to selectively permit or prevent PLL 540 from using the internal feedback path. For example, if signal intfb_en is set to a logic high value, then the value of signal sel_int_ext passed by logic 516 may switch in response to the operation of logic 514 on signal pll_wakeup_sync and a signal int_lock to select the internal feedback path or the external feedback path by a multiplexer 558. If signal intfb_en is set to a logic low value, then signal sel_int_ext may remain at a logic high value to select only the external feedback path by multiplexer 558 (e.g., while a signal fbk_sel selects one of signals PLL external feedback).

Clock tree 520 includes various clock signal paths and a multiplexer 522 which may be used to select one or more of the clock signal paths as part of the external feedback path for PLL 540. In one embodiment, multiplexer 522 may be controlled by a signal clkmux provided by one or more user-programmable fuses.

User logic 530 may be used to perform a handshake operation with feedback control logic 510 using signal pll_wakeup_sync to indicate when circuits of the external feedback path are powered on and ready for use. Accordingly, feedback control logic 510 may switch PLL 540 from the internal feedback path to the external feedback path in response to signal pll_wakeup_sync.

PLL 540 includes a phase frequency detector 542, a charge pump 544, a loop filter 546, an oscillator 548, dividers 550, 560, and 566, a lock detection block 552, and multiplexers 554, 556, 558, 562, and 564. It will be appreciated that one or more components of PLL 540 may be used to generate one or more clock signals (e.g., one or more signals VCO_CLOCK and pll_out) which may be passed through the internal feedback path as one or more signals PLL internal feedback, or passed through the external feedback path as one or more signals PLL external feedback.

Multiplexer 554 may be used to select between a signal PLL internal feedback (e.g., provided by the internal feedback path) and a signal PLL external feedback (e.g., provided by the external feedback path) in response to signal fbk_sel. Multiplexer 556 may be used to select between different internal feedback paths in response to a signal clkmux_fb (e.g., a multiplexer selection signal). In one embodiment, signal clkmux_fb may be provided by one or more user-programmable fuses with the same settings as signal clkmux. Multiplexer 558 may be used to select between different input signals received through various feedback paths and multiplexers 554 and 556 in response to a signal sel_int_ext.

Multiplexer 562 may be used to select between different reference signals ref1 and ref2 in response to a signal ref_sel. Multiplexer 564 may be used to select between a reference signal provided by multiplexer 562 or other reference signals (not shown), used as a dummy multiplexer to match the feedback path, or used to disable the providing of a reference signal to divider 566.

Lock detection block 552 may be used to provide a signal pll_lock (e.g., a lock detection signal) to indicate whether PLL 540 has locked on to a signal received through the external feedback path (e.g., to indicate whether the external feedback path signal is synchronized with the reference signal). Lock detection block 552 may also be used to provide signal int_lock (e.g., a lock detection signal) to indicate whether PLL 540 has locked on to a signal received through the internal feedback path (e.g., to indicate whether the internal feedback path signal is synchronized with the reference signal). Lock detection block 552 provides signals pll_lock and int_lock to user logic 530 to indicate the lock status of PLL 540.

Figure 6:
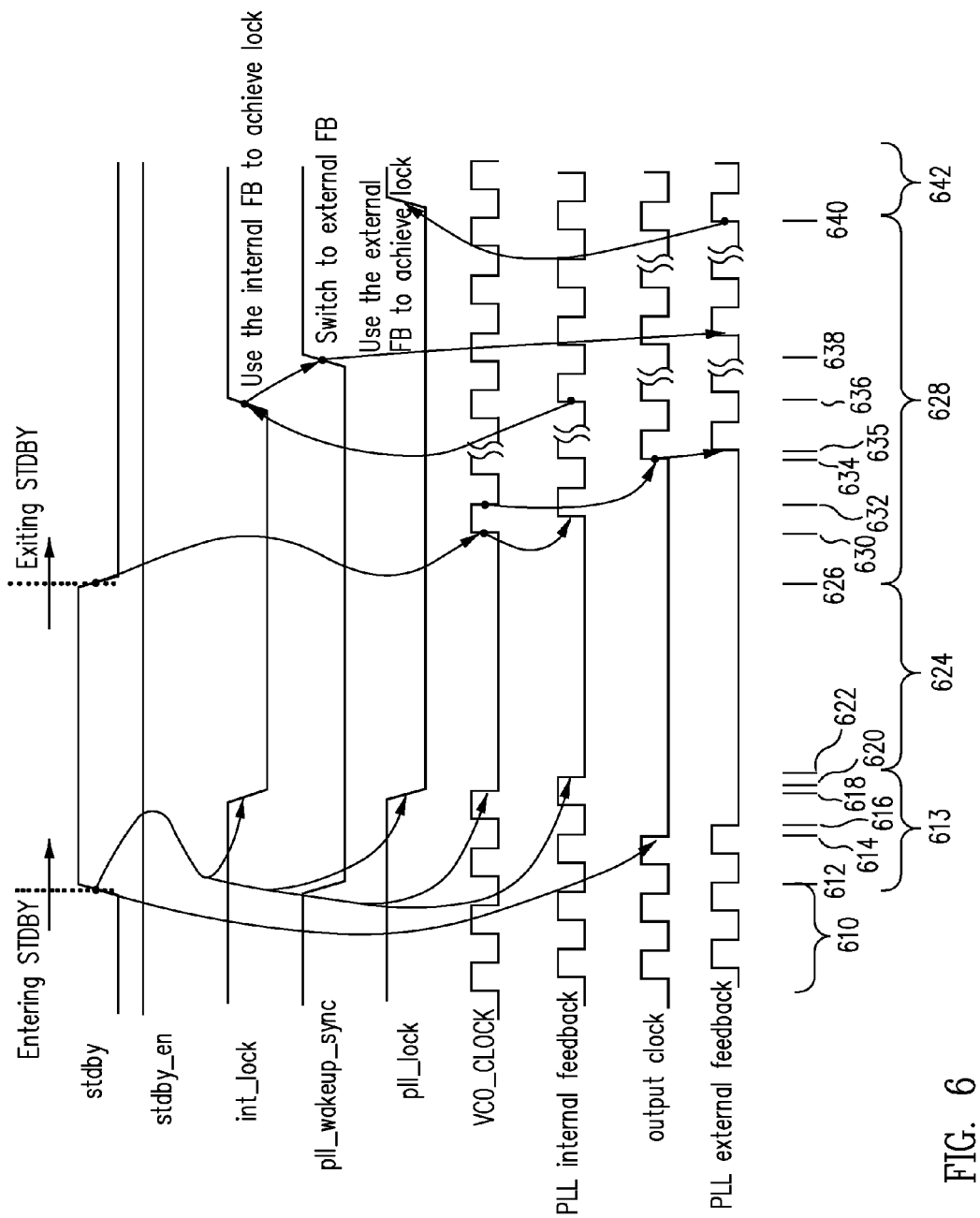
FIG. 6 illustrates a timing diagram of signals for various components of FIGS. 2, 3, and 5 in accordance with an embodiment of the invention.

FIG. 6 illustrates a timing diagram of signals for various components of FIGS. 2, 3, and 5 in accordance with an embodiment of the invention. In particular, FIG. 6 identifies the operation of signals during a process of entering and exiting standby operation mode for PLL 540 and one or more circuits in its external feedback path. In one embodiment, the switching between standby operation mode and normal operation mode described in FIG. 6 may occur substantially simultaneously with such operations as described in FIG. 4.

At all times in FIG. 6, signal stdby_en is set to a logic high value to permit PLD 100 to operate in standby operation mode. Also, in FIG. 6, it is assumed that signal intfb_en is set to a logic high value to permit PLL 540 to use either the internal or external feedback paths.

During a time period 610 (e.g., prior to a time 612) signal stdby is set to a logic low value and PLD 100 is in normal operation mode. Accordingly, PLL 540, external circuits (e.g., clock tree 520), and other portions of PLD 100 operate in normal operation mode. Such components may remain in normal operation mode indefinitely while signal stdby remains at a logic low value.

Also during time period 610, lock detection block 552 maintains signal int_lock at a logic high value (e.g., in response to a previous lock achieved using the internal feedback path), and also maintains signal pll_lock at a logic high value (e.g., in response to a previous lock achieved using the external feedback path). In one embodiment, lock detection block 552 may be implemented to hold signal int_lock at a logic high value after phase and frequency lock have been acquired using an internal feedback signal, and may continue to hold signal int_lock at the logic high value after the feedback signal is switched to the external feedback signal, as long as frequency lock is achieved with the external feedback signal. In this regard, lock detection block 552 may ignore phase differences (e.g., attributable to different lengths of the internal and external feedback paths) when performing a lock using the external feedback signal. In one embodiment, signal sel_int_ext may be provided to lock detection block 552 to identify whether the current feedback signal is an internal feedback signal or an external feedback signal.

Also during time period 610, user logic 530 maintains signal pll_wakeup_sync at a logic high value to indicate that circuits of PLD 100 external to PLL 540 (e.g., external circuits of the external feedback path) are powered up and operational.

Also during time period 610, PLL 540 is powered on and provides signal VCO_CLOCK from oscillator 548 and signal pll_out from divider 550. Signal pll_out passes through the internal feedback path as signal PLL internal feedback, and passes through the external feedback path as signal PLL external feedback. As discussed, signal pll_out may be used to provide signal output clock identified in FIG. 6.

Also during time period 610, signals sel_int_ext and fbk_sel may be set to logic high values to pass signal PLL external feedback to PLL 540 through multiplexers 554 and 558. Accordingly, PLL 540 uses the external feedback path during time period 610 in normal operation mode.

During a time period 613 (e.g., beginning at time 612 and ending at a time 622), PLD 100 switches between normal operation mode and standby operation mode.

At time 612, signal stdby transitions to a logic high value. As a result, PLD 100 begins to enter standby operation mode. In response to the logic high value of signal stdby, user logic 530 switches signal pll_wakeup_sync to a logic low value. As a result, signal sel_int_ext switches to a logic low value to select the internal feedback path for PLL 540.

At a time 614, signal output clock switches to a logic low value as previously discussed with regard to time 415 in FIG. 4. Quickly thereafter at a time 616, signal PLL external feedback is interrupted. In this regard, various external circuitry in the external feedback path may turn off in response to signal stdby transitioning to a logic high value which interrupts signal PLL external feedback.

At a time 618, signals int_lock and pll_lock transition to logic low values, for example, in response to an intermediate signal provided to PLL 540 in response to the rising edge of signal stdby.

At a time 620, signal VCO_CLOCK is interrupted, for example, in response to oscillator 548 turning off as power to PLL 540 is interrupted for standby operation mode. As a result, signal PLL internal feedback (e.g., which is provided in response to signal VCO_CLOCK) is interrupted at time 622.

During a time period 624 (e.g., beginning at time 622 and ending at a time 626), PLD 100 remains in standby operation mode. As discussed, PLD 100 may remain in standby operation mode indefinitely while signal stdby remains at a logic high value.

During a time period 628 (e.g., beginning at time 626 and ending at a time 640), PLD 100 switches from standby operation mode to normal operation mode.

At time 626, signal stdby transitions back to a logic low value. As a result, oscillator 548 is powered on again and begins providing signal VCO_CLOCK at a time 630 which causes signal PLL internal feedback to begin operating at a time 632.

At a time 634, signal output clock is provided as previously discussed with regard to time 434 in FIG. 4. Quickly thereafter, signal PLL external feedback begins passing through the external feedback path at a time 635.

As discussed, signal sel_int_ext previously switched to a logic low value to select the internal feedback path for PLL 540 at time 612. Accordingly, while PLD 100 switches from standby operation mode to normal operation mode, PLL 540 uses the internal feedback path. As a result, PLL 540 may quickly achieve lock without waiting for other external circuitry to be powered up and become operational.

Accordingly, at a time 636, lock detection block 552 detects a lock between signal PLL internal feedback and the current reference signal received by PLL 540. As a result, lock detection block switches signal int_lock to a logic high value.

At a time 638, user logic 530 determines that all external circuitry used for the external feedback path is now powered up and operational. As a result, user logic 530 switches signal pll_wakeup_sync to a logic high value which causes PLL 540 to use the external feedback path.

At time 640, lock detection block 552 detects a lock between signal PLL external feedback and the current reference signal received by PLL 540. As a result, lock detection block switches signal pll_lock to a logic high value. As discussed, lock detection block 552 may continue to hold signal int_lock at the logic high value while frequency lock is maintained with the external feedback signal. Accordingly, signal int_lock remains set to a logic high value as shown in FIG. 6.

During a time period 642 (e.g., beginning at time 640 and continuing thereafter), PLD 100 operates in normal operation mode and may remain in normal operation mode indefinitely while signal stdby remains at a logic low value. Similar to FIG. 4, the switching between normal operation mode and standby operation mode in FIG. 6 may be repeated as desired.

Embodiments described above illustrate but do not limit the invention. It should also be understood that numerous modifications and variations are possible in accordance with the principles of the invention. Accordingly, the scope of the invention is defined only by the following claims.

We claim:

1. A method of operating a device, the method comprising:
providing power to operate a signal source of the device during a normal operation mode of the device;
passing an output signal from the signal source through a signal path to an output node during the normal operation mode;
receiving an operation mode signal to switch the device from the normal operation mode to a low power operation mode;
disabling the signal path to prevent glitches from appearing at the output node during the switch from the normal operation mode to the low power operation mode;
continuing providing power to the signal source until after the signal path is disabled;
interrupting power to disable the signal source during the low power operation mode;
receiving the operation mode signal to switch the device back from the low power operation mode to the normal operation mode;
providing power to operate the signal source in response to the operation mode signal;
continuing disabling the signal path until after the signal source begins operating to prevent glitches from appearing at the output node during the switch from the low power operation mode to the normal operation mode; and
enabling the signal path when the device returns to the normal operation mode.

2. The method of claim 1, wherein the enabling is performed in response to a transition of the output signal to a logic value.

3. The method of claim 2, wherein the enabling comprises stopping holding the output node at the logic value.

4. The method of claim 2, wherein the enabling further comprises:
capturing the logic value in response to the transition of the output signal; and
enabling the signal path in response to the captured logic value.

5. The method of claim 1, wherein the output signal is a clock signal.

6. The method of claim 1, wherein the device is a programmable logic device (PLD).

7. A device comprising:
a signal source adapted to provide an output signal when powered;
a power switch;
an output node;
a signal path adapted to pass the output signal from the signal source to the output node during a normal operation mode of the device; and
a power control block adapted to:
    operate the power switch to provide power to operate the signal source during the normal operation mode of the device;
    receive an operation mode signal to switch the device from the normal operation mode to a low power operation mode;
    disable the signal path to prevent glitches from appearing at the output node during the switch from the normal operation mode to the low power operation mode;
    operate the power switch to continue to provide power to operate the signal source until after the signal path is disabled;
    operate the power switch to interrupt power to disable the signal source during the low power operation mode;
    receive the operation mode signal to transition the device back from the low power operation mode to the normal operation mode;
    operate the power switch to provide power to operate the signal source in response to the operation mode signal;
    keep the signal path disabled until after the signal source begins operating to prevent glitches from appearing at the output node during the switch from the low power operation mode to the normal operation mode; and
    enable the signal path when the device returns to the normal operation mode.

8. The device of claim 7, wherein the power control block is adapted to enable the signal path in response to a transition of the output signal to a logic value.

9. The device of claim 8, further comprising a switch adapted to stop holding the output node at the logic value in response to the power control block.

10. The device of claim 8, wherein the power control block comprises a flip flop adapted to capture the logic value in response to the transition of the output signal and pass the captured logic value to enable the signal path.

11. The device of claim 7, wherein the output signal is a clock signal.

12. The device of claim, 7 wherein the device is a programmable logic device (PLD).

13. An integrated circuit, comprising:
a PLL including an external feedback path operable during a normal operation mode to provide a PLL external feedback signal from a PLL output to a PLL input;
a power switch; and
a power control block adapted to:
    operate the power switch to provide power to the PLL during the normal operation mode of the device;
    switch the PLL from the normal operation mode to a standby operation mode;
    disable the external feedback path during the switch from the normal operation mode to the standby operation mode; and
    operate the power switch to continue to provide power to the PLL until after the external feedback path is disabled and then to interrupt power to the PLL.

14. The integrated circuit of claim 13, wherein:
the PLL includes an internal feedback path operable during the standby operation mode to provide a PLL internal feedback signal from the PLL output to the PLL input; and
the power control block is adapted to select the internal feedback path for the PLL in place of the external feedback path before disabling the external feedback path.

15. The integrated circuit of claim 14, wherein the power control block is adapted to:
switch the PLL from the standby operation mode back to the normal operation mode;
operate the power switch to provide power to the PLL during the switch; and
select an external feedback path for the PLL in place of the internal feedback path after the PLL achieves lock with the PLL internal feedback signal.

16. The integrated circuit of claim 13, wherein the power control block is adapted to receive an operation mode signal to switch the PLL between the normal operation mode and the standby operation mode.

17. The integrated circuit of claim 13, wherein the integrated circuit is a programmable logic device (PLD).

18. A method of operating a PLL in an integrated circuit, comprising:
providing power to the PLL during a normal operation mode of the integrated circuit, the PLL including an external feedback path operable during the normal operation mode to provide a PLL external feedback signal from a PLL output to a PLL input;
switching the PLL from the normal operation mode to a standby operation mode;
disabling the external feedback path during the switch from the normal operation mode to the standby operation mode;
continuing to provide power to the PLL until after the external feedback path is disabled; and
interrupting power to the PLL.

19. The method of claim 18, wherein the PLL includes an internal feedback path operable during the standby operation mode to provide a PLL internal feedback signal from the PLL output to the PLL input, the method including:
selecting the internal feedback path in place of the external feedback path before disabling the external feedback path.

20. The method of claim 19 including:
switching the PLL from the standby operation mode back to the normal operation mode;
providing power to the PLL during the switch; and
selecting an external feedback path for the PLL in place of the internal feedback path after the PLL achieves lock with the PLL internal feedback signal.

* * * * *